United States Patent [19]

Hekimian et al.

[11] 4,132,957
[45] Jan. 2, 1979

[54] PROGRAMMABLE AMPLIFIER

[75] Inventors: Norris C. Hekimian, Rockville; Chong-Soo Kim, Gaithersburg, both of Md.

[73] Assignee: Hekimian Laboratories, Inc., Rockville, Md.

[21] Appl. No.: 845,668

[22] Filed: Oct. 26, 1977

[51] Int. Cl.² ............................................. H03G 3/02
[52] U.S. Cl. ........................................ 330/51; 330/86; 330/110; 330/282; 330/284
[58] Field of Search .................... 330/51, 86, 110, 282, 330/284

[56] References Cited
U.S. PATENT DOCUMENTS

| | | | |
|---|---|---|---|
| 3,815,039 | 6/1974 | Fujisawa et al. | 330/86 X |
| 4,048,576 | 9/1977 | Blackburn et al. | 330/86 X |

OTHER PUBLICATIONS

Metz, "Combination Logic Cuts Parts in Digitally Controlled Amplifier", *Electronics*, Sep. 18, 1975, pp. 94,95.

*Primary Examiner*—James B. Mullins
*Attorney, Agent, or Firm*—Rose & Edell

[57] ABSTRACT

The gain of an operational amplifier is switched between +K dB and −K dB by switching circuit positions of the input and feedback impedances. The gain is changed in 0.1 dB steps by changing either the input or feedback impedance by a ratio of 1.0116 for each step. The gain is changed in 1.0 dB steps by changing the other of the feedback or input impedance by a ratio of 1.122 for each step. A novel two-pole switching arrangement employs the foregoing techniques to permit unambiguous gain polarity changes.

8 Claims, 3 Drawing Figures

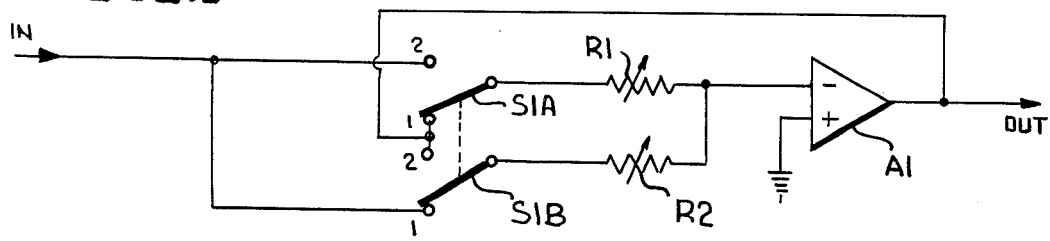
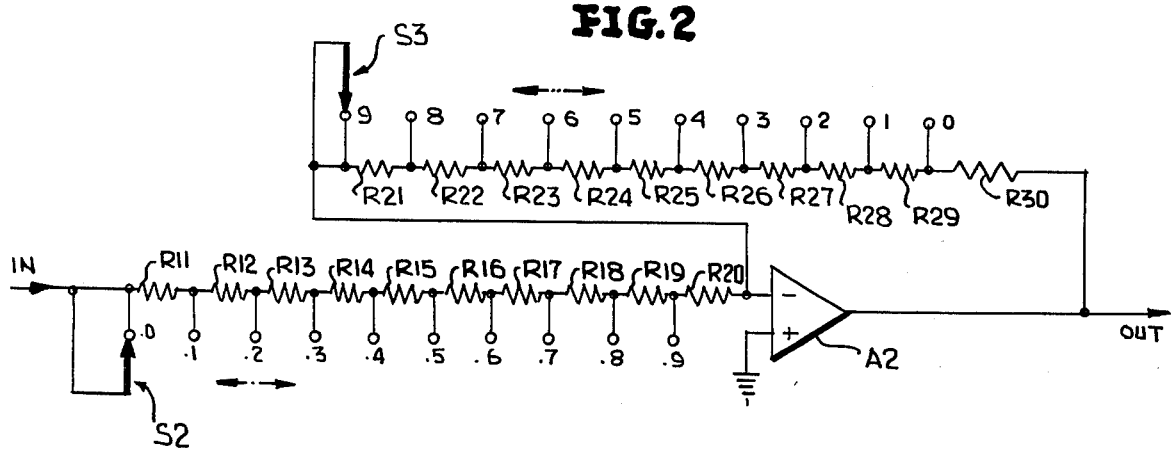
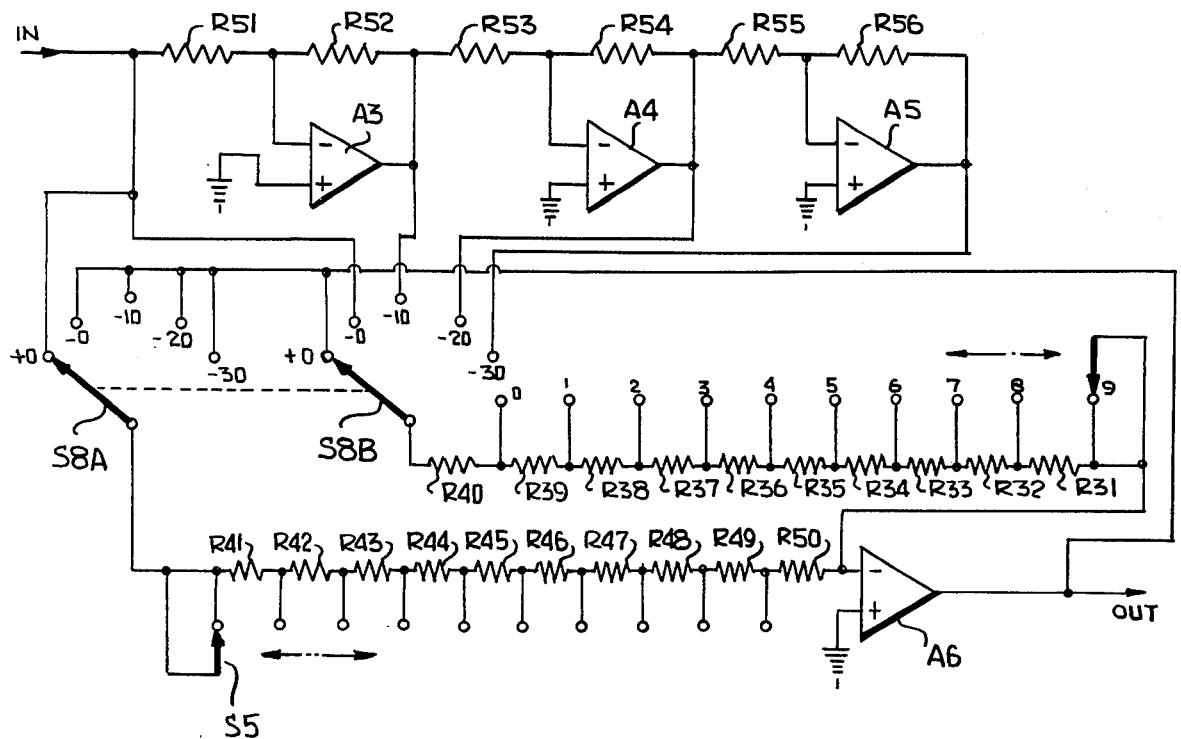

PROGRAMMABLE AMPLIFIER

BACKGROUND OF THE INVENTION

The present invention relates to variable gain amplifiers and, more particularly, to amplifiers having gains which are capable of being switched in discrete steps calibrated in dB. Although the present invention is described for use in measuring parameters in telephone transmission systems, it is to be understood that the principles described herein have utilization in any field in which it is desirable to calibrate amplifier gain in dB.

It is a common requirement for telephone system test equipment to have amplifiers with gains which are manually adjustable to particular gain levels calibrated in dB. Quite often the required gain range extends between negative gains (i.e. attenuation) and positive gain (i.e. amplification) values. For example, it is common to require a range of +10 dBm to −40 dBm for test level point (TLP) and transmit level (TXL) settings. It is desirable that the adjustments be in steps of 0.1 dB. In the prior art such adjustment is commonly realized with the use of three thumb wheel switches, as follows: (1) a first thumbwheel switch having two positions for polarity determination; (2) a second thumbwheel switch having four positions for tens unit determination (i.e. 0, 10, 20 and 30 dBm); and (3) a third thumbwheel switch having ten positions for units determination. It is clear that this arrangement permits settings between −39 dBm to +39 dBm, a large part of this range being outside either of the TLP and TXL setting requirements. In fact, the controlled amplifier is normally designed only to operate over the required range so that over much of the settable range of the switches the setting does not correspond to the amplifier gain. A major part of the difficulty lies in the fact that increments in settings when above zero dBm represent greater values whereas increments in settings when below zero dBm represent lesser values; the prior art did not accommodate this fact. Further, unduly complex and expensive circuitry is employed in prior art switching circuits to effect the desired setting capability.

It is therefore an object of the present invention to provide a simple, inexpensive amplifier circuit in which the gain is switchable from +K dB to −K dB, where K is some arbitrary number.

It is another object of the present invention to provide an amplifier with a gain which is switchable in calibrated steps of 0.1 dB, 1.0 dB, or 10 dB, over a range which includes both positive and negative gains.

It is a further object of the present invention to provide an extremely simple and inexpensive switching arrangement to achieve the aforementioned objects.

SUMMARY OF THE INVENTION

In accordance with the present invention an operational amplifier includes a switching circuit which is capable of reversing the positions of the input and feedback impedances to the amplifier. When so switched the impedances effect a polarity change in the gain without changing the absolute value in dB. To effect 0.1 dB gain changes either the input or feedback impedance is changed in steps having a 1.0116 ratio. To effect 1.0 dB gain changes the other of the feedback or input impedance is change in steps having a 1.122 ratio. Control over the gain is achieved with three thumbwheel switches, as follows: (1) a first thumbwheel switch having to determine both polarity and tens value and having two poles and five positions +0, −0, −10, −20 and −30 for a +10 dBm to −40 dBm range; (2) a second thumbwheel switch having ten positions for units values determination; and (3) a third thumbwheel switch having ten positions for tenths value determination.

BRIEF DESCRIPTION OF THE DRAWINGS

The above and still further objects, features and advantages of the present invention will become apparent upon consideration of the following detailed description of one specific embodiment thereof, especially when taken in conjunction with the accompanying drawings, wherein:

FIG. 1 is a schematic diagram of a circuit according to one aspect of the present invention.

FIG. 2 is a schematic diagram of a circuit according to another aspect of the present invention; and FIG. 3 is a schematic diagram of a circuit combining the features of FIGS. 1 and 2.

DESCRIPTION OF PREFERRED EMBODIMENTS

Referring specifically to FIG. 1 of the accompanying drawings, an operational amplifier A1 includes an inverting input terminal (−), a grounded non-inverting input terminal (+), and an output terminal. Two variable resistors R1 and R2 are tied together at a common junction which is connected to the inverting input terminal of amplifier A1. The opposite side of resistor R1 is connected to the arm of switch S1A whereas the opposite side of resistor R2 is connected to the arm of switch S1B. Switches S1A and S1B are ganged single pole double throw switches having positions 1 and 2. In position 1, switch S1B connects resistor R2 to the circuit input terminal and switch S1A connects resistor R1 to the output terminal of amplifier A1 which constitutes the circuit output terminal. Therefore, in position 1 (as shown) of the switches, resistor R2 is the input resistor for the operational amplifier and resistor R1 is the feedback resistor. The gain of the circuit in dB for this configuration is as follows:

$$G_1 = 20 \log R1/R2 = 20 \log R1 - 20 \log R2 \qquad (1)$$

When switch S1A and S1B are in position 2, resistor R2 becomes the circuit feedback resistor and R1 becomes the input resistor. The gain of the circuit in dB under such conditions is as follows:

$$G_2 = 20 \log R2/R1 = 20 \log R2 - 20 \log R1 \qquad (2)$$

It is noted that $G_1$ and $G_2$ differ in polarity but have the same absolute value in dB. Therefore, by simply reversing the positions of the input and feedback resistors in an operational amplifier, one can effect a gain polarity reversal without changing the absolute value of the gain in dB. This constitutes one aspect of the present invention.

Referring now to FIG. 2 of the accompanying drawings, an operational amplifier A2 has an inverting input terminal (−), a grounded non-inverting input terminal (+) and an output terminal. An amplifier input resistor comprises ten series-connected resistors R11 through R20, inclusive, connected between the circuit input terminal and the amplifier inverting input terminal. The amplifier feedback resistor comprises ten series-connected resistors R21 through R30, inclusive, connected between the amplifier output and inverting input terminals.

A ten position switch S2 includes an arm connected to the circuit input terminal and ten contacts, nine of which are connected, respectively, to the junctions between series-connected resistors R11 through R20, the additional contact being connected to the junction between the circuit input terminal and resistor R11. A ten position switch S3 includes an arm connected to the investing input terminal of amplifier A2. Ten contacts of S3 are connected, respectively, prior to each of resistors R21 through R30 in the feedback path.

Switch S2 is used to select one or more of resistors R11 through R20 to constitute the input resistor for amplifier A2. Specifically, switch S2 can select R20 alone, or R20 plus R19; R20 plus R19 plus R18; etc., thereby increasing the input resistance by including another series resistor with each step or switch position. Likewise, switch S3 is used to select one or more resistors R21 through R30 to constitute the feedback resistor for amplifier A2. Specifically, switch S3 can select R30 alone, R30 plus R29; R30 plus R29 plus R28; etc., thereby increasing the feedback resistance by including another series resistor with each step or switch position. If the values of resistors R11 through R20 are properly chosen, each step can change the gain of the circuit by 0.1 dB. Likewise, if the values of resistors R21 through R30 are properly chosen, each step can change the gain of the circuit by 1.0 dB. One possible set of resistance values (in ohms) for achieving this end is as follows:

TABLE I

| R20 | 90.16K | R15 | 1.093 K |
|-----|--------|-----|---------|
| R19 | 1.044 K | R14 | 1.106 K |
| R18 | 1.056 K | R13 | 1.119 K |
| R17 | 1.068 K | R12 | 1.132 K |
| R16 | 1.081 K | R11 | 1.145 K |
| R30 | 100 K | R25 | 19.34 K |
| R29 | 12.20 K | R24 | 21.70 K |
| R28 | 13.69 K | R23 | 24.35 K |
| R27 | 15.36 K | R22 | 27.32 K |
| R26 | 17.34 K | R21 | 30.65 K |

For the resistance values listed above, the resistance of the input resistor changes by the factor 1.0116 for successive settings of switch S2. In other words $$\frac{R20 + R19}{R20} = 1.0116; \frac{R20 + R19 + R18}{R20 + R19} = 1.0116;$$
$$\frac{R20 + R19 + R18 + R17}{R20 + R19 + R18} = 1.0116; \text{ etc.}$$

The factor 1.0116 corresponds to 0.1 dB; that is, 20 $\log_{10}$ 1.0116 = 0.1 dB. Similarly, for the resistances listed above, the resistance of the feedback resistor changes by the factor 1.122 for successive settings of switch S3. In other words $$\frac{R30 R29}{R30} = 1.122; \frac{R30 + R29 + R28}{R30 + R29} = 1.122;$$
$$\frac{R30 + R29 + R28 + R27}{R30 + R29 + R28} = 1.122, \text{ etc.}$$

The factor 1.122 corresponds to 1.0 dB; that is, 20 $\log_{10}$ 1.122 = 1.0 dB. Thus each change of one position in switch S2 changes the amplifier gain by 0.1 dB; each one position change in switch S3 corresponds to a gain change of 1.0 dB.

It should also be noted that the sum of R11 through R20, inclusive, is equal to R30. Thus, when switch S2 is in its extreme left position and switch S3 is in its extreme right position (so that R30 is the feedback resistor and all of resistors R11 through R20 are in the input resistor), the circuit gain is (100K/100K) = 1, which corresponds to 0 dB. This equality of resistance is therefore provided to assure that there is a 0 dB setting for the switches.

The specific resistance values listed in Table I are not unique, there being an infinite number of combinations which will achieve the 0.1 dB and 1.0 gain steps. However, the ratio of resistances between steps (1.0116; 1.122) must be used to achieve the proper calibration (0.1 dB; 1.0 dB). As an illustration of one setting of the switches S2 and S3 using the values of Table I, if switch S2 is in its extreme right position and switch S3 is in its extreme left position (as viewed in FIG. 2), the feedback resistor includes all of resistances R21 through R30, whereas the input resistor includes R20 alone. The value of the feedback resistor, from Table I, turns out to be 281.85K ohms; the input resistor is R20 or 90.16K ohms. The gain, therefore, is 20 $\log_{10}$ (281.85/90.16) = 9.9.

FIG. 3 is a circuit which incorporates the features of the circuits in both FIGS. 1 and 2 and also adds the capability of changing the gain by steps of 10 dB. The circuit includes four operational amplifiers A3, A4, A5, and A6, each having inverting (−) and grounded non-inverting (+) input terminals. The input resistors for amplifiers A3, A4 and A5 are resistors R51, R53 and R55, respectively; the feedback resistors for these amplifiers are R52, R54 and R56, respectively. Amplifiers A3, A4 and A5 are connected in cascade and each has a gain of −10 dB; that is, $$20 \log_{10} \frac{R52}{R51} = 20 \log_{10} \frac{R54}{R53} = 20 \log_{10} \frac{R56}{R55} = -10 \text{ dB, or}$$
$$\frac{R52}{R51} = \frac{R54}{R53} = \frac{R56}{R55} = 0.3162.$$

Thus, if $R52 = R54 = R56 = 3.162K$ ohms, then $R51 = R53 = R55 = 10K$ ohms.

A first string of series-connected resistors R31 through R40 is tied at one end to the inverting input terminal of amplifier A6 along with one end of a second string of series-connected resistors R41 through R50. The opposite end of resistor string R31 through R40 is connected to the wiper arm of switch pole S8B whereas the opposite end of resistor string R41–R50 is connected to the wiper arm of switch pole S8A. Switches S8A and S8B are part of a double pole five-position switch having +0, −0, −10, −20 and −30 positions. The +0 position of switch S8A is connected to the circuit input terminal along with resistor R51 and the −0 position of switch S8B. The −0, −10, −20, and −30 positions of switch S8A and the +0 position of switch S8B are connected to the output terminal of amplifier A6. The −10, −20, and −30 positions of switch S8B are connected to the output terminals of amplifiers A3, A4, and A5, respectively.

When the poles of switch S8 are in the +0 position, resistor string R41 through R50 defines the input resistor for amplifier A6; resistor string R31 through R40 defines the feedback resistor. In all other positions of switch S8 the input resistor is defined by resistor string R31 through R40 and the feedback resistor is defined by resistor string R41 through R50. The only difference between positions −0, −10, −20 and −30 is the fact that the input signal is forced to pass through none, one, two or three of amplifiers A3, A4 and A5. It is seen, therefore, that switch S8 serves the dual function of gain polarity selection (by reversing positions of the input and feedback resistors) and tens value selection (by incorporating different stages of −10 dB gain in the signal applied to the input resistor).

Resistor strings R31 through R40 and R41 through R50 are similar to strings R21 through R30 and R11 through R20, respectively, in FIG. 2. Likewise, switches S4 and S5 are similar to switches S3 and S2, respectively, of FIG. 2. Thus each step change of switch S5 changes the gain of amplifier A6 by 0.1 dB, and each step change of switch S4 changes the gain of amplifier A6 by 1.0 dB.

In a preferred embodiment switch S8 is a two pole thumbwheel switch (or two single poles) and switches S4 and S5 are single pole ten position thumbwheel switches. The three thumbwheel switches permit calibrated adjustment of circuit gain over a range from −39.9 dB to +9.9 dB in 0.1 dB steps. As a sample calculation to bear this out, the following example is offered. To obtain a gain of −16.6 dB. switch S8 is placed in the −10 dB position, switch S4 is placed in the 6 dB position and switch S5 is placed in the 0.6 dB position. The input signal experiences a −10 dB gain (10 dB attenuation) in amplifier A3 and is then passed by switch pole S8B to the input resistor for amplifier A6 which constitutes resistors R34 through R40 connected in series. The feedback resistor constitutes resistors R47 through R50 connected in series. Using Table I, with R41 through R50 corresponding to R11 through R20, the feedback resistor is R20 + R19 + R18 + R17 which equals 93.328K ohms. The input resistor, using the values of Table I and setting R31 through R40 equal to R21 through R30, includes R30 + R29 + R28 + R27 + R26 + R25 + R24 which equals 199.53K. The gain of amplifier A6 is therefore:

$$G = 20 \log (93.328/199.53) = -6.6 \text{ dB}.$$

Adding the −10 dB provided by amplifier A3, the total circuit gain is −16.6 dB, corresponding to the assumed switch setting. If switch S5 is now changed to the 0.7 position, the feedback resistor is reduced by shorting R47, leaving only R48, R49 and R50 in the feedback circuit. The feedback resistor becomes 92.26K ohms and the gain is:

$$G = 20 \log (92.26/199.53) = -6.7 \text{ dB}.$$

This is added to the −10 dB contribution from amplifier A3 to result in an overall gain of −16.7 dB, a 0.1 dB difference from the previous setting.

It will be evident to those of ordinary skill in the art that different gain steps other than described herein may be selected. For example, if 0.2 dB steps are desired, the ratio of 1.0233 should be used instead of 1.0116; if 0.5 dB steps are desired, the ratio of 1.0593 should be used instead of 1.0116; etc. Likewise, changes in the gains of A3, A4, and A5 can produce various step changes, and changes in the resistance ratio along resistor string R31 through R40 produce various other changes. The gain steps need not be in dB and need not be uniform. Further, although described in terms of resistances, the present invention is suitably embodied with inductive or capacitive impedances, or combinations of these and resistive impedances.

While we have described and illustrated one specific embodiment of our invention, it will be clear that variations of the details of construction which are specifically illustrated and described may be resorted to without departing from the true spirit and scope of the invention as defined in the appended claims.

We claim:

1. An adjustable gain circuit in which the gain may be adjusted without ambiguity to gain levels above and below 0 dB, said circuit comprising:

a circuit input terminal;

a circuit output terminal;

an inverting operational amplifier having an inverting input terminal and an output terminal;

first impedance means having first and second terminals;

second impedance means having third and fourth terminals;

first switch means having at least first and second poles and at least two positions for each pole, each pole having a movable member and at least first and second fixed contacts ganged such that the movable member in said first pole must contact the first fixed contact or the second fixed contact in that pole whenever the movable member in the second pole contacts the first fixed contact or second fixed contact, respectively, in the second pole;

means connecting said first terminal to the movable member of said first pole;

means connecting said second terminal to the inverting input terminal of said amplifier;

means connecting said third terminal to the movable member of said second pole;

means connecting said fourth terminal to the inverting input terminal of said amplifier;

means connecting the first fixed contact of said first pole to the second fixed contact of said second pole and to said circuit input terminal;

means connecting the second fixed contact of said first pole to the first fixed contact of said second pole and to said circuit output terminal;

wherein said first impedance means comprises a first plurality of individual series-connected impedances connected between said first and second terminals, said individual impedances being arranged in a first sequence and having predetermined values such that $(R_n/R_{n-1})$ is a first constant, where $R_n$ is the impedance sum of the first n impedances in said first sequence, $R_{n-1}$ is the impedance sum of the first $n-1$ impedances in said first sequence, and n is any integer between 2 and said first plurality;

wherein said second impedance means comprises a second plurality of further individual series-connected impedances connected between said third and fourth terminals, said further individual impedances being arranged in a second sequence and having predetermined values such that $(R_m/R_{m-1})$ is a second constant, where $R_m$ is the impedance sum of the first m of said second sequence of further individual impedances, $R_{m-1}$ is the impedance sum of the first $m-1$ of said second sequence of further individual impedances, and m is any integer between 2 and said second plurality;

second multi-position manually actuable switch means for selectively eliminating from said first impedance means all but the first x individual impedances of said first sequence, where x is a selectable integer between 1 and said first plurality; and third multi-position manually actuable switch means for selectively eliminating from said second impedance means all but the first y further individual impedances of said second sequence, where y is a selectable integer between 1 and said second plurality.

2. The circuit according to claim 1 wherein:
said first plurality equals ten;
said second plurality equals ten;
said first constant is 1.0116; and
said second constant is 1.122.

3. The circuit according to claim 1 wherein:
said second switch means comprises a first movable arm and a first plurality of fixed switch contacts, each switch contact being electrically connected to a point in said first sequence of impedances following a respective individual impedance, said first movable arm being electrically connected to said first terminal and being movable to selectively contact each of said first plurality of switch contacts individually; and
said third switch means comprises a second movable arm and a second plurality of fixed switch contacts, each of said second plurality of switch contacts being electrically connected to a point in said second sequence of impedances following a respective individual impedance, said second movable arm being electrically connected to said fourth terminal and being movable to selectively contact each of said second plurality of switch contacts individually.

4. The circuit according to claim 1 further comprising:
a third position in each of said first and second poles of said first switch means, said third position being represented by a third fixed contact;
amplifier means of pre-determined gain having an input terminal and an output terminal;
means coupling said amplifier input terminal to said circuit input terminal; and
means coupling said amplifier output terminal to said third fixed contact.

5. The circuit according to claim 4 wherein said amplifier means has a gain whose magnitude is 10 dB.

6. An adjustable gain circuit in which the gain is adjustable unambiguously over a range which extends above and below 0 dB, said circuit comprising:
a circuit input terminal;
a circuit output terminal;
an inverting operational amplifier having an inverting input terminal and an output terminal;
means connecting said amplifier output terminal to said circuit output terminal;
first and second adjustable impedance means;
first operator-actuable switch means having at least first and second positions designated +0 dB and −0 dB, respectively, said switch means being operative in one of said positions to connect said first adjustable impedance means in series between said circuit input terminal and said inverting input terminal and to connect said second adjustable impedance means in series between said operational amplifier output terminal and said inverting input terminal, said switch means being operative in the other of said positions to connect said first adjustable impedance means in series between said operational amplifier output terminal and said inverting input terminal and to connect said second adjustable impedance means in series between said circuit input terminal and said inverting input terminal;
second operator-actuable switch means, having plural positions calibrated in equal dB increments, for selectively adjusting the impedance of said first adjustable impedance means in predetermined impedance steps such that the gain of said amplifier changes by one of said equal dB increments for each impedance step change; and
third operator-actuable switch means, having plural positions calibrated in equal dB increments, for selectively adjusting the impedance of said second adjustable impedance means in predetermined impedance steps such that the gain of said amplifier changes by one of said equal dB increments for each impedance step change.

7. The circuit according to claim 6 wherein:
said equal db increments are 1.0 dB; and
the number of positions of said first and second switch means is ten.

8. The circuit according to claims 6 further comprising:
a plurality of additional positions of said first operator-actuable switch means, each additional position being designated as a respective multiple of 10 dB; and
means for varying the gain of said amplifier in 10 dB steps in response to switching of said first operator-actuable switch means to successive ones of said additional positions.

* * * * *